United States Patent [19]
Lane

[11] 3,978,420
[45] Aug. 31, 1976

[54] SELF-TUNING FILTER
[75] Inventor: L. Jubin Lane, Stuarts Draft, Va.
[73] Assignee: General Electric Company, Salem, Va.
[22] Filed: Apr. 28, 1975
[21] Appl. No.: 572,433

[52] U.S. Cl............................... 330/107; 328/167; 330/109; 333/80 R
[51] Int. Cl.² ........................................ H03F 1/36
[58] Field of Search ............ 328/167, 223; 330/107, 330/109; 333/80 R

[56] References Cited
UNITED STATES PATENTS
3,786,363  1/1974  Lelie ............................... 330/109 X OTHER PUBLICATIONS
Brochure F20–8/71 of Frequency Devices, Inc., pp. 1–4, Aug. 1971.
Brochure C086–10–1/71 of Analog Devices, Inc., pp. 1–4, Jan. 1971.
DeBoo, et al. "Automatically Tuned Filter Uses IC Operational Amplifiers," EDN/EEE pp. 39–41; Feb. 1972.
"Applied Ideas—" Electronic Engineering p. 27, Oct. 1972.

Primary Examiner—R. V. Rolinec
Assistant Examiner—Lawrence J. Dahl
Attorney, Agent, or Firm—Arnold E. Renner; Philip L. Schlamp

[57] ABSTRACT

A self-tuning filter is provided through the employment of a voltage tunable filter circuit which simulates a series resistor-inductor-capacitor (RLC) circuit and which is tunable to vary or adjust its resonant frequency in response to the value of an input control voltage. The filter is made self-tuning through the provision of suitable circuitry, responsive to simulated inductance and capacitance voltages, to generate the input control voltage and hence render the voltage tunable filter circuit resonant at the frequency of an applied input signal.

12 Claims, 5 Drawing Figures

SELF-TUNING FILTER

BACKGROUND OF THE INVENTION

The present invention relates generally to electronic filter circuits and more particularly to an electronic filter circuit which is self-tuning to be resonant at the frequency of an applied input signal. The basic purpose of any filter of this nature is to pass those signals of desired frequency and to reject or block signals of other frequencies. The other frequency signals are often in the form of "noise" or harmonics which are superimposed on the signal desired to be passed. If the fundamental input signal to be filtered is of relatively constant frequency very few problems are experienced in that the bandwidth of the filter may be made relatively narrow thus passing freely a signal of desired frequency while rejecting all other signals. When, however, the frequency of the input signal varies considerably, difficulty is experienced in producing a filter which sharply distinguishes between the desired and the unwanted frequencies. In such situations it is desirable to provide a filter whose resonant frequency varies or "tracks" the frequency of a fundamental input signal.

One example of a usage in which the desired signal has a frequency which varies widely is that of a self-excited generator system. In one type of this kind of system the output of the generator is utilized to excite the generator field through the triggering of suitable switching devices (e.g., thyristors) in the excitation system. The output frequency of the generator is related to its speed which can vary drastically, particularly at start up. The magnitude of the generator output also varies with speed (often as much as 15:1). These variations in frequency and magnitude coupled with the fact that the generator output is often nonsinusoidal and inclusive of a relatively large amount of "noise" present serious problems in the derivation of an accurate signal for the triggering of the switching devices. This is particularly true when it is realized that in many instances the noise may result in more than one zero crossing for each cycle of the basic frequency.

SUMMARY OF THE INVENTION

It is, therefore, an object of the present invention to provide an improved self-tuning filter.

It is a further object to provide an electronic filter which automatically adjusts its resonant frequency to that of its input signal.

It is a still further object to provide an electronic filter which simulates a series RLC circuit and which utilizes signals developed within the filter circuit to self-tune the filter to resonance at the frequency of its input signal.

It is an additional object to provide a self-tuning filter circuit which utilizes internally generated signals to adjust itself to be resonant at the frequency of an input signal.

The foregoing and other objects are achieved, in accordance with the present invention, by providing a voltage tunable filter circuit which simulates or synthesizes a series RCL circuit. Signals within this circuit corresponding to the simulated inductance and capacitance voltages are utilized, in a feedback mode, to generate the voltage signal utilized to adjust the resonant frequency of the filter to the frequency of the input signal and thus make the filter automatically self-tuned.

BRIEF DESCRIPTION OF THE DRAWINGS

Although the novel features of this invention are set forth with particularity in the claims annexed to and forming a part of this specification, the invention, both as to organization and content will be better understood and appreciated along with other objects and features thereof from the following detailed description taken in conjunction with the accompanying drawings in which:

DETAILED DESCRIPTION

Figure 1:
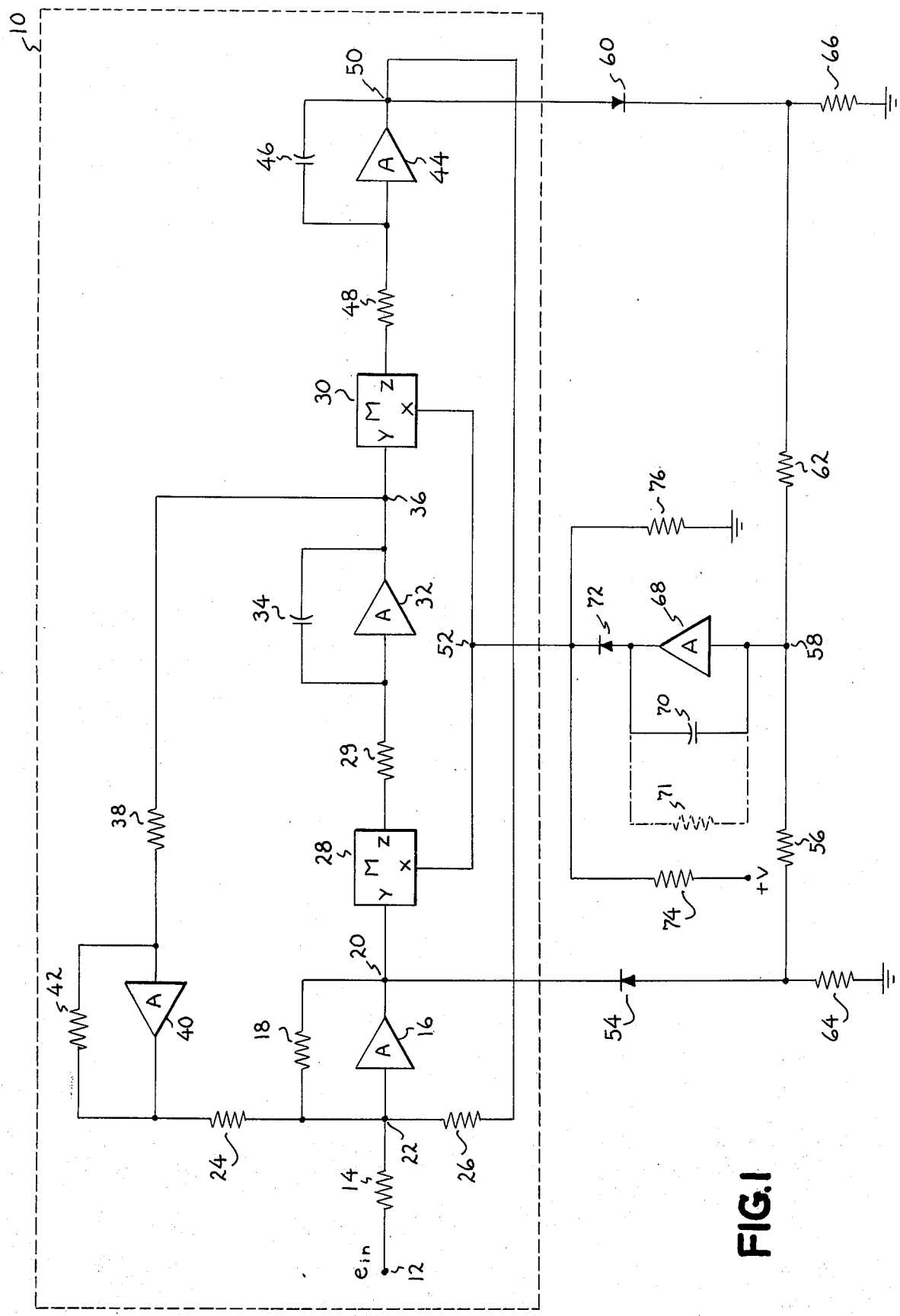
FIG. 1 is a schematic diagram of a self-tuning filter in accordance with the preferred embodiment of the present invention.

Referring now to FIG. 1 there is, within the dashed outline (block 10), a voltage tunable filter circuit. By voltage tunable is meant that the resonant frequency of the circuit may be adjusted by adjusting the magnitude of an input control voltage as will be more fully explained hereinafter. Voltage tunable filter circuits functioning as the device of block 19 functions are generally known and commercially available as an integrated package. For example, such voltage tunable filter circuits are available from Frequency Devices, Inc. as a "300 Series Voltage Tunable Active Filter". Alternatively, the voltage tunable filter may be comprised of components as illustrated in FIg. 1 and have the function as hereinafter described.

Filter circuit 10 includes an input terminal 12 for receiving the input signal from any appropriate source (not shown). As an example of an input signal, reference is made to FIG. 2 which illustrates by the wave shape $e_{in}$ a signal which is basically a sine wave upon which a plurality of irregularities are superimposed, generally in the form of noise as is well understood in the art. The input signal at terminal 12 is applied by way of an input resistor 14 to a suitable summing amplifier 16. Amplifier 16 may be a conventional operational amplifier including a feedback resistor 18 tied between its output (junction 20) and its input (junction 22). Two additional inputs by way of resistors 24 and 26 are also supplied to the amplifier 16. The signals thus applied correspond, respectively, as will be more fully understood as this description proceeds, to the voltage corresponding to the resistive and capacitive components of the simple RLC circuit simulated by the filter circuit 10. As is known, the voltage relationships existing in a simple RLC circuit can be defined by the equation:

$$V_L = e - V_R - V_C$$

wherein;
 $e$ = the instantaneous applied voltage
 $V_L$ = the inductor voltage
 $V_R$ = the resistor voltage
 $V_C$ = the capacitor voltage.

Thus, there appears at junction 20, the output of amplifier 16, a voltage which represents the inductance voltage of the simulated RLC circuit.

The signal at junction 20 is applied to a y input of a multiplier 28 which also has an x input and an output z. Multiplying circuits such as used at 28 are known in the art and provide, at their z output terminal, a signal which is a function of the product of the two input signals to the x and y terminals. Mathematically, the relationship existing in a multiplier circuit can be expressed by the formula: $z = x \cdot y \cdot k$; wherein $k$ is a constant determined by the multiplier used. While many such multiplier circuits are commercially available, that used in an actual implementation of the present invention was sold by Analog Devices, Inc. and is identified as a Model 432J. The signal applied to the $x$ input of multiplier 28 is the control voltage previously mentioned and the derivation of which will be explained hereinafter.

The output of multiplier 28 is applied to an integrator having an input resistor 29, and an operational amplifier 32 having a capacitor 34 tied between its output and its input. The output of this integrator, that is the output of amplifier 32 which appears at junction 36, is representative of the current which exists in the simulated RLC circuit and as such will also be proportional to the resistance voltage of that simulated circuit. This signal, because of the inverting nature of operational amplifiers, is of the incorrect relative polarity and it is, therefore, applied by way of a resistor 38 to an inverting amplifier 40 having a resistor 42 tied between its output and input. The output of amplifier 40 is applied by way of the previously mentioned resistor 24 to the input of amplifier 16 and thus forms the resistive voltage component earlier described.

The output of amplifier 32 (junction 36) is applied to the $y$ input terminal of a second multiplier 30 which may be identical to multiplier 28. The signal applied to the $x$ input of the multiplier 30 is the same as that applied to the $x$ input of multiplier 28—the control voltage or voltage feedback signal. The output of multiplier 30 is applied to a second integrator including a resistor 48 and an operational amplifier 44 having a capacitor 46 tied between its input and its output. The output of this integrator, at junction 50, will represent the voltage across the capacitor of the simulated RLC circuit. This signal, via the resistor 26, is delivered to the input junction 22 of the amplifier 16. Thus it is seen that amplifier 16 will provide as its output a signal which is representative of the simulated inductance voltage because it has as its input the three components described and identified in the formula above; i.e. the input voltage, the resistive voltage and the capacitive voltage—the latter two being negative and the former positive.

On several occasions mention has been made of the voltage control or voltage feedback signal which varies the resonant frequency of the voltage tunable filter. This voltage, as was previously described, is applied to the $x$ terminals of each of the multipliers 28 and 30 from a junction 52. The generation of the control voltage is as follows. The signal appearing at junction 20, representing the simulated inductance voltage, is applied by way of a diode 60 and a resistor 62 to the junction 58. Diode 60 is poled so as to conduct only negative signals from the junction 20 to the junction 58. The signal at junction 50, the simulated capacitance voltage, is applied by way of a diode 60 and a resistor 62 to the junction 58. Diode 60 is poled to conduct only positive signals to the junction 58. Two additional resistors 64 and 66 are connected, respectively, between the anode of diode 54 and cathode of diode 60 and ground. The resistors 64 are 64 and 66 more than leakage resistors to take any leakage current through the diodes to ground and prevent them from affecting the operation of the total system. If diodes 54 and 60 were perfect these resistors would be unnecessary and they are included here only for purposes of accuracy and complete illustration.

The signal appearing at junction 58 is applied to an operational amplifier 68 having a capacitor 70 connected between its output and its input. A resistor 71, shown in phantom, may be connected in parallel with the capacitor 70. In a larger sense, resistors 56 and 62, amplifier 68, capacitor 70 and resistor 71 form a low pass filter circuit for the development of the control voltage for delivery to junction 52. In the preferred embodiment, the special case of the low pass filter, commonly referred to as an integrator, is utilized so that the cut-off frequency of the low pass filter circuit is moved from some finite positive value to zero. Therefore, in the preferred embodiment, resistor 71 is not present (or, viewed in another way, the resistance of 71 is infinite) and the composite signal of the simulated inductance and capacitance voltages as exists at junction 58 is integrated and this integrated signal is applied via a diode 72, poled to conduct positive signals from the amplifier 68, to the junction 52 of the voltage tunable filter circuit 10.

The final depiction of FIG. 1 includes a pair of resistors 74 and 76 which are connected between a source of positive potential indicated as +V and ground to form a voltage divider. The junction of these two resistors is connected to the cathode of diode 72. This voltage divider forms a simple bias circuit to insure that junction 52 always remains positive. As an example, if the voltage of +V werre approximately 15 volts and the value of resistor 74 were 14 times that of resistor 76, a positive voltage of approximately 1 volt would be the minimum maintained at junction 52.

Figure 2:
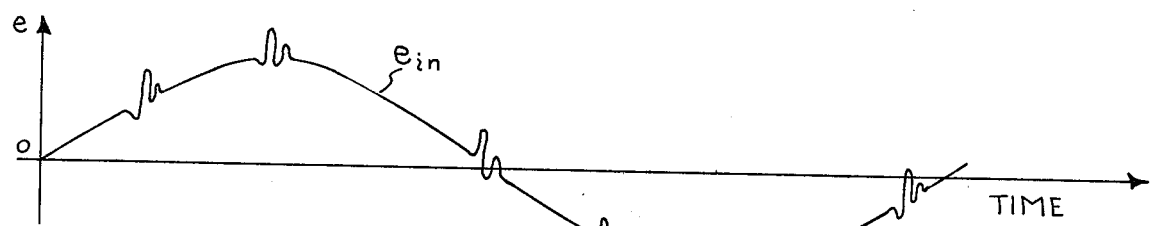
FIGS. 2 through 5 illustrate various wave shapes useful in the better understanding of the invention.
Figure 3:
Figure 4:
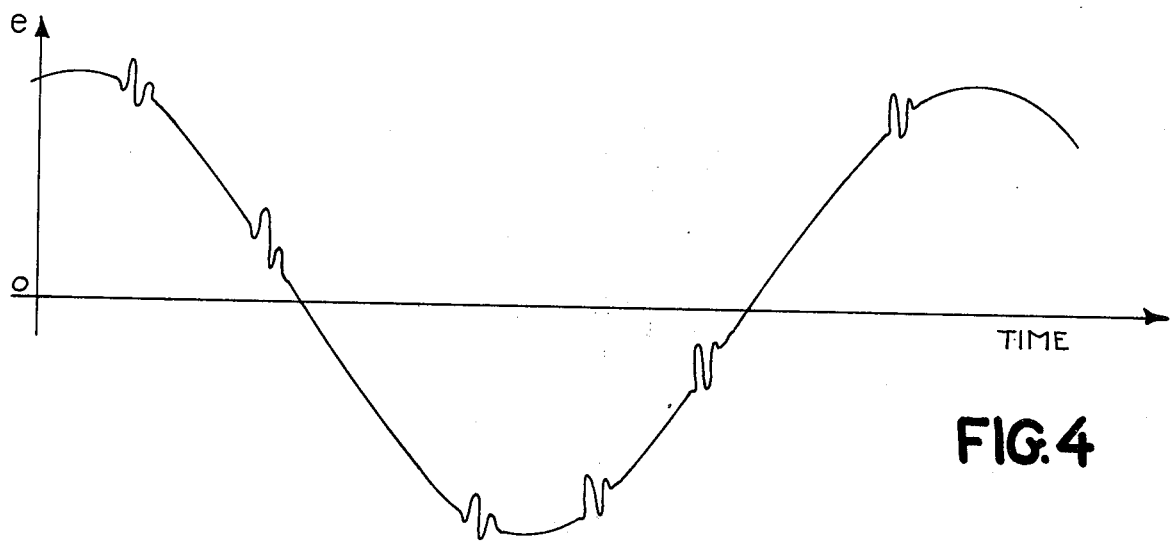
Figure 5:
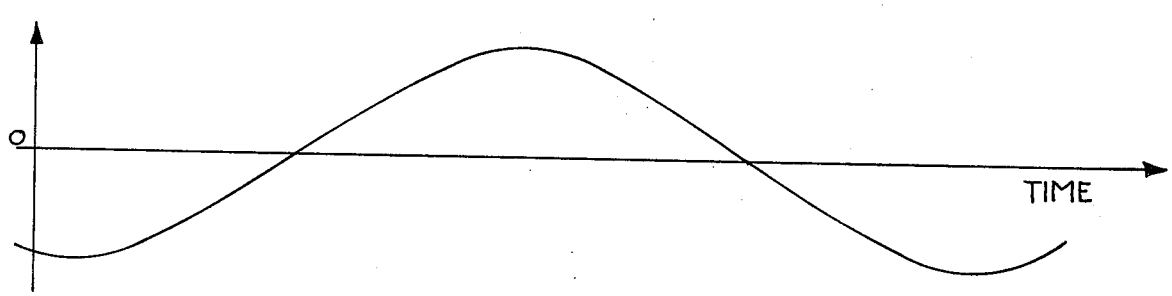

The operation of the circuit of FIG. 1 is as follows and may be best understood by considering FIG. 1 in conjunction with the wave shapes of FIGS. 2–5. Assume now that there is applied at the input terminal 12 a signal $e_{in}$ such as is illustrated in FIG. 2. In accordance with the illustrated wave shapes, it will be assumed that this signal is of a frequency higher than the existing resonant frequency of the circuit. The overall circuit is, therefore, slightly inductive and the simulated current will lag the input signal. The signal representing the resistive voltage components of the simulated circuit would, of course, be in phase with the simulated current and, as is illustrated in FIG. 3, this resistive voltage will lag the input signal. (The illustrated lag is approximately 15 electrical degrees.) The inductance voltage at junction 20, ignoring the inherent inversion attendant to an operational amplifier, (FIG. 4) will lead the simulated current by 90 electrical degrees while the capacitor voltage (FIG. 5) at junction 50, again ignoring the inversion function, will lag the simulated current by 90 electrical degrees such that there is 180° phase difference between these two signals. In the example being described the input frequency is higher than the resonant frequency of the circuit such that the inductance voltage, which will still include higher frequency noise, (FIG. 4) will be of a larger magnitude than the capacitance voltage (FIG. 5). Because resistors 56 and 62 are equal and the volting at junction 20 is higher than the voltage at junction 50, the net input to the amplifier 68 will be negative. Thus, the value of the signal applied by way of diode 72 to the junction 52 and hence to the $x$ terminals of the two multipliers 28 and 30 will be increasing. In accordance with the operation of circuit 10, this will tend to raise the resonant frequency of that circuit until such time as the value of the two signals applied to the junction 58 are equal and the circuit is at resonance at the frequency of the input signal. Conversely, if the input signal were below the resonant frequency of the circuit 10 the signal at junction 50 would be higher than that of junction 20 resulting in a net positive input to the amplifier 68 thus decreasing the value of the signal applied to the x terminals of the multipliers 28 and 30 and decreasing the resonant frequency until such time as these two signals are once again equal indicating that the circuit is at resonance at the frequency of the applied input signal to the terminal 12. In either case when the two signals applied to amplifier 68 are equal, indicating resonance, the output of amplifier 68 will no longer change and the circuit 10 will stabilize until such time as the frequency of the input signal ($e_{in}$) changes.

Thus, it is seen that there has been provided a self-tuning filter circuit which automatically adjusts itself to be resonant at the frequency of the input signal. Insofar as utilizable outputs are concerned, such may be taken from any place within the circuit but would normally be from one of the junctions 20, 36 or 50 within the circuit 10 in the same manner as one would take a usable signal from a simple RLC resonant circuit; recognizing, of course, that high frequency noise will still be present at junction 20.

While there has been shown and described what is considered to be the preferred embodiment of the invention modifications thereto will readily occur to those skilled in the art. It is not desired, therefore, that the invention be limited to the specific arrangement shown and described and it is intended to cover in the appended claims all modifications as fall within the true spirit and scope of the invention.

What is claimed is:
1. A self-tuning electronic filter comprising:
   a. a tunable filter circuit responsive to an input signal for simulating a series resistance-inductance-capacitance circuit, said circuit providing voltages representative of the inductance and capacitance voltages of said simulated circuit and being responsive to the magnitude of an input control voltage to vary the resonant frequency of said filter circuit; and,
   b. feedback means responsive to the voltages representing the inductance voltage and the capacitance voltage to produce said input control voltage to thereby vary the resonant frequency of said filter circuit.

2. The invention in accordance with claim 1 wherein said feedback means varies the resonant frequency of said tunable filter circuit to make said filter circuit resonant at the frequency of said input signal.

3. The invention in accordance with claim 1 wherein said feedback means comprises a low pass filter circuit including means for combining the voltages representing the inductance voltage and the capacitance voltage to provide a difference signal having a value proportional to the difference in magnitude between the inductance voltage and the capacitance voltage and means responsive to said difference signal to generate said control voltage whereby the resonant frequency of said tunable filter circuit is varied to match the frequency of said input signal.

4. The invention in accordance with claim 3 wherein said feedback means further includes two feedback paths for conducting, respectively, representations of the inductance and capacitance voltages and wherein each of said paths includes a diode, the diode of the first of said paths being poled to conduct a signal of a first relative polarity and the diode of the second of said paths poled to conduct a signal of the opposite relative polarity.

5. The invention in accordance with claim 4 wherein the diode connected to conduct the representation of the inductance voltage is poled to conduct a relatively negative voltage.

6. The invention in accordance with claim 3 wherein said low pass filter circuit is an integrator to thereby perform an integration function on said difference signal.

7. An electronic filter adapted to provide self-tuning to the frequency of an input signal comprising;
   a. a voltage tunable filter circuit for simulating a series resistor-inductor-capacitor circuit having resonant frequency which is adjustable in response to a control voltage, said filter circuit comprising,
      1. the summation amplifier for producing at its output a first voltage signal representing the voltage of the inductance of the simulated resistor-inductor-capacitor circuit in response to an input signal, a signal representing the capacitance voltage and a signal representing the resistance voltage,
      2. a first multiplying circuit responsive to the output of said summation amplifier and the value of the control voltage to provide a signal proportional to the product thereof,
      3. a first integrating circuit responsive to the output of said first multiplying circuit to provide a signal proportional to the resistance voltage of the simulated circuit,
      4. a second multiplying circuit responsive to the output of said first integrating circuit and the value of the control voltage to provide an output proportional to the product thereof, and
      5. a second integrating circuit responsive to the output of said second multiplying circuit to produce a signal proportional to the capacitance voltage of said simulated circuit; and,
   b. feedback means responsive to the voltages representing the inductance voltage and the capacitance voltage to produce said control voltage to thereby vary the resonant frequency of said filter circuit.

8. The invention in accordance with claim 7 wherein said feedback means varies the resonant frequency of said filter circuit to make said filter circuit resonant at the frequency of said input signal.

9. The invention in accordance with claim 7 wherein said feedback means comprises a low pass filter circuit including means for combining the voltages representing the inductance voltage and the capacitance voltage to provide a difference signal having a value proportional to the difference in magnitude between the inductance voltage and the capacitance voltage and means responsive to said difference signal to generate said control voltage whereby the resonant frequency of such filter circuit is varied to match the frequency of said input signal.

10. The invention in accordance with claim 9 wherein said feedback means further includes two feedback paths for conducting respectively representations of the inductance and capacitance voltages and wherein each of said paths includes a diode, the diode of the first of said paths being poled to conduct a signal of a first relative polarity and the diode of the second of said paths poled to conduct a signal of the opposite relatively polarity.

11. The invention in accordance with claim 10 wherein the diode connected to conduct the representation of the inductance voltage is poled to conduct a relatively negative voltage.

12. The invention in accordance with claim 9 wherein said low pass filter circuit is an integrator to thereby perform an integration function on said difference signal.

* * * * *

UNITED STATES PATENT AND TRADEMARK OFFICE
CERTIFICATE OF CORRECTION

PATENT NO. : 3,978,420
DATED : August 31, 1976
INVENTOR(S) : L. Jubin Lane

It is certified that error appears in the above-identified patent and that said Letters Patent are hereby corrected as shown below:

Column 1, line 62, cancel "RCL" and substitute --RLC--.

Column 2, line 24, cancel "19" and substitute --10--.

Column 3, line 55, cancel "60" and substitute --54--.
          line 55, cancel "62" and substitute --56--.
          line 56, cancel "60" and substitute --54--.
          line 64, after "64" delete "are 64".
          line 64, after "66" insert --are nothing--.

Column 4, line 62, cancel "ing" and substitute --age--.

Column 6, line 45, after "voltage" (second occurrence) insert --signal--.

Signed and Sealed this

Twenty-ninth Day of March 1977

[SEAL]

Attest:

RUTH C. MASON
*Attesting Officer*

C. MARSHALL DANN
*Commissioner of Patents and Trademarks*